United States Patent
Kang et al.

(10) Patent No.: US 8,362,542 B2
(45) Date of Patent: Jan. 29, 2013

(54) SEMICONDUCTOR DEVICES COMPRISING A PLURALITY OF GATE STRUCTURES

(75) Inventors: Dae-Woong Kang, Seoul (KR); Sung-Nam Chang, Seoul (KR); Jin-Joo Kim, Seoul (KR); Kyong-Joo Lee, Kyunggi-Do (KR); Eun-Jung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 356 days.

(21) Appl. No.: 12/847,351

(22) Filed: Jul. 30, 2010

(65) Prior Publication Data

US 2010/0295113 A1    Nov. 25, 2010

Related U.S. Application Data

(63) Continuation of application No. 11/551,680, filed on Oct. 20, 2006, now abandoned.

(30) Foreign Application Priority Data

Oct. 31, 2005  (KR) ........................ 10-2005-0103107

(51) Int. Cl.
  *H01L 29/788* (2006.01)
(52) U.S. Cl. ......... 257/315; 257/E21.581; 257/E21.209; 257/E21.613; 438/257
(58) Field of Classification Search .................. 257/314, 257/315, 321, 386, E21.581, E21.573, E21.209, 257/E21.613; 438/201, 211, 257
  See application file for complete search history.

(56) References Cited

U.S. PATENT DOCUMENTS

| | | | |
|---|---|---|---|
| 4,532,594 A | 7/1985 | Hosaka et al. | |
| 6,468,877 B1 | 10/2002 | Pradeep et al. | |
| 6,894,341 B2 * | 5/2005 | Sugimae et al. | 257/315 |
| 7,045,849 B2 * | 5/2006 | Chen et al. | 257/314 |
| 2003/0151069 A1 | 8/2003 | Sugimae et al. | |
| 2004/0004863 A1 | 1/2004 | Wang | |
| 2004/0038489 A1 | 2/2004 | Clevenger et al. | |
| 2004/0232496 A1 | 11/2004 | Chen et al. | |
| 2005/0023597 A1 | 2/2005 | Futsukake et al. | |

FOREIGN PATENT DOCUMENTS

| | | |
|---|---|---|
| JP | 2002-76299 | 3/2002 |
| JP | 2003-078131 | 3/2003 |
| JP | 2005-39216 | 2/2005 |
| KR | 2002-0081926 | 10/2002 |
| KR | 2003-0078750 | 10/2003 |
| KR | 2004-0018155 | 3/2004 |
| KR | 2005-0000324 | 1/2005 |

OTHER PUBLICATIONS

English language abstract for Korean Publication No. 2002-0081926.
English language abstract for Korean Publication No. 2004-0018155.

(Continued)

*Primary Examiner* — David Vu
(74) *Attorney, Agent, or Firm* — Myers Bigel Sibley & Sajovec, P.A.

(57) ABSTRACT

Semiconductor devices including a plurality of gate structures disposed on a semiconductor substrate are provided. Each of the gate structures includes a tunnel dielectric layer, a floating gate, an inter-gate dielectric layer, a control gate, and a mask layer. Liners cover opposing sidewalls of adjacent floating gates. Spacers are disposed on the liners, the spacers protruding from opposing sidewalls of adjacent ones of the gate structures, and a top of each of the spacers is disposed below a top of a corresponding one of the gate structures. The liners define sidewalls of respective air gaps and the spacers define tops of the respective air gaps.

13 Claims, 9 Drawing Sheets

OTHER PUBLICATIONS

English language abstract for Korean Publication No. 2005-0000324.
English language abstract for Japanese Publication No. 2003-078131.
English language abstract for Japanese Publication No. 2005-39216.
Chang-Hyun Lee, et al. "A Novel SONOS Structure of $SiO_2$/SiN/$Al_2O_3$ With TaN Metal Gate for Multi-Giga Bit Flash Memories", IEEE 2003, 4 pages.
Dae-Woong Kang, et al. "The Air Spacer Technology for Improving the Cell Distribution in 1 Giga Bit NAND Flash Memory", IEEE, 2006, 2 pages.

* cited by examiner

SEMICONDUCTOR DEVICES COMPRISING A PLURALITY OF GATE STRUCTURES

CROSS-REFERENCE TO RELATED APPLICATIONS

The present application is a continuation of and claims priority from U.S. patent application Ser. No. 11/551,680, filed Oct. 20, 2006 now abandoned, which claims the benefit of Korean Patent Application No. 10-2005-0103107, filed on Oct. 31, 2005, the disclosures of which are hereby incorporated by reference herein in their entireties.

BACKGROUND

1. Technical Field

This disclosure generally relates to semiconductor devices and, more particularly, to semiconductor devices such as memory devices having an air gap defined between adjacent gate structures and methods of fabricating the same.

2. Description of the Related Art

Among semiconductor devices, non-volatile memory devices are commonly used in consumer electronic devices because information can be retained in the device even when no power is supplied. Advances in consumer electronics cause demand for ever higher density memory devices. Efforts to manufacture devices meeting this demand often involve scaling down the sizes of gate structures and minimizing the space between adjacent gate structures.

Unfortunately, these efforts often result in increased parasitic capacitance between adjacent structures in the memory cell regions. Such increases in parasitic capacitance reduce the speed of the memory devices. Also, variation in parasitic capacitance between gate structures causes a variation in the threshold voltage for each gate structure, thereby degrading the reliability of memory devices.

FIG. 1a is a circuit diagram of a typical NAND flash memory array, which is a popular type of non-volatile memory device. As shown in FIG. 1a, the NAND flash memory array includes a string select line SSL, a ground select line GSL, a common source line CSL, a plurality of word lines W/L#0-31, and a plurality of bit lines BL crossing across the other lines. FIG. 1b is a schematic plan view of a typical NAND flash memory array corresponding to FIG. 1a. In FIG. 1b, active regions 16 and bit line contacts 146 are illustrated together with floating gates 22. FIG. 1c is a cross-sectional view of a NAND flash memory structure of FIG. 1b taken along the wordline direction. In the wordline direction, a cell gate structure includes a control gate 24, an inter-gate dielectric layer 23, a floating gate 22, a tunnel oxide 21, and isolation regions 15 formed on a semiconductor substrate 10. FIG. 1d is a cross-sectional view of the NAND flash memory structure of FIG. 1b taken along the bitline direction. As shown in FIG. 1d, in the bitline direction cell gate structure includes the control gate 24, the inter-gate dielectric layer 23, the floating gate 22, the tunnel oxide 21, and impurity regions 16 formed on the semiconductor substrate 10.

FIG. 2 is a perspective view of a portion of a NAND memory cell array. The capacitances between various portions of the memory cell array and the voltages on some of the floating gates are identified in FIG. 2. For example, $V_{fg}$ is a voltage at a central floating gate and $V_{eg}$ is a voltage at a central control gate. Further, V1 and V2 are voltages between adjacent floating gates in the x-direction; and V3 and V4 are voltages between adjacent floating gates in the y direction. Furthermore, V5 and V6 are voltages between.... In addition, C stands for parasitic overlap capacitance. Using the relationship Q=CV as applied to the structure in FIG. 2, Equation 1 and 2 are developed. Equation 1 describes the variation of the floating gate voltage ($\Delta V_{fg}$) in one of the NAND memory cells of FIG. 2 as a function of the surrounding capacitances and voltages.

$$\Delta V_{fg} = \frac{C_{fgy}(\Delta V_3 + \Delta V_4)}{C_{ono} + C_{tun} + 2C_{fgx} + 2C_{fgy} + 2C_{fgcg}} \quad \text{(Equation 1)}$$

As shown in Equation 1, decreasing $C_{fgy}$, the capacitance between adjacent floating gates 22 in the bitline direction, results in a decrease in the variation of the floating gate voltage ($\Delta V_{fg}$). Therefore, a low $C_{fgy}$ improves the threshold voltage distribution among the cell gates in the memory cell array.

Equation 2 describes the floating gate voltage ($V_{fg}$) of one of the memory cells of FIG. 2 as a function of the surrounding voltages and capacitances.

$$V_{fg} = \frac{C_{ono} * V_{cg} + C_{fgx}(V_1 + V_2) + C_{fgy}(V_3 + V_4) + C_{fgcg}(V_5 + V_6)}{C_{ono} + C_{tun} + 2C_{fgx} + 2C_{fgy} + 2C_{fgcg}} \quad \text{(Equation 2)}$$

As shown in Equation 2, decreasing $C_{fgy}$ results in an increase in $V_{fg}$. Consequently, the coupling ratio can be increased and the speed performance of the device can be improved.

From the analysis above, one method to improve device performance as device density is increased is to reduce the parasitic capacitance between adjacent floating gates. Typically, the spaces between adjacent floating gates are filled by an insulating layer whose dielectric constant is a primary factor in determining the capacitance between the adjacent floating gates. An insulating layer formed from a material having a higher dielectric constant will cause increased parasitic capacitance between adjacent gate structures. Consequently, it is desirable to form the dielectric layer from the lowest dielectric constant material possible.

Table 1 is a list of the approximate dielectric constants of several materials. Typical dielectric layers are formed from silicon oxide or silicon nitride materials. As shown in Table 1, these materials have dielectric constants of approximately 3.9 and 7.8, respectively. Air, on the other hand, has an approximate dielectric constant of 1.005. Consequently, a substantial reduction in the parasitic capacitance between adjacent gate structures can be achieved by replacing the silicon oxide or nitride dielectric material commonly used in semiconductor, e.g., memory structures with air. Further, it is desired to fill as much of the space between adjacent gates as possible with air, as opposed to another dielectric material, to minimize the parasitic capacitance.

TABLE 1

| Material | Dielectric Constant |
| --- | --- |
| Vacuum | 1 (By definition) |
| Air | 1.005 |
| Polyethylene | 2.25 |
| Paper | 3 |
| Silicon oxide | 3.9 |
| Silicon nitride | 7.8 |
| Rubber | 7 |
| Silicon | 11.68 |

TABLE 1-continued

| Material | Dielectric Constant |
|---|---|
| Methyl alcohol | 30 |
| Water | 80 |
| Barium Titanate | 1200 |

One approach to reduce parasitic capacitance between adjacent gate structures is disclosed in U.S. Published Patent Application No. 20050023597 to Kutsukake et al. (hereinafter referred to as "Kutsukake"). In Kutsukake, air gaps are formed between gate structures simultaneously with gate sidewall spacers due to the conformal dielectric layer deposition process. Another approach is disclosed in Korean Published Patent Application 2002-0081926, in which air gaps are formed by depositing a thicker spacer layer on an upper portion of gate sidewalls than on a bottom portion thereof. One disadvantage of these approaches is that the area between adjacent gates is largely filled with an oxide dielectric layer with a relatively small air pocket. Therefore, the parasitic capacitance between the gates is not reduced as much as it would be if substantially the entire area were filled by an air gap or pocket.

This disclosure overcomes this and other disadvantages of previous approaches to minimizing the parasitic capacitance between adjacent gate structures.

SUMMARY

This disclosure is directed to methods of forming air gaps between adjacent gate structures that maximizes the volume filled by the air gap in order to minimize the parasitic capacitance between the gate structures, as well as devices fabricated in accordance with the methods.

In one embodiment, a semiconductor device comprises at least two adjacent gate structures disposed on a semiconductor substrate; and an air gap extending between the gate structures, wherein the air gap is substantially rectangular in cross-section.

In another embodiment, a semiconductor device comprises at least two adjacent cell gate structures disposed on a semiconductor substrate, the cell gate structures adapted to store a charge; and a protection layer disposed on opposing sidewalls of the at least two adjacent gate structures, the protection layer defining an air gap between the at least two adjacent cell gate structures, the protection layer having opposing vertical portions, each disposed between the air gap and the opposing sidewalls of the at least two adjacent gate structure, and a horizontal portion, disposed between the air gap and the semiconductor substrate, the vertical portions each having a substantially uniform thickness.

As a result, the volume of the air gaps is maximized and the width thereof made uniform in order to minimize the parasitic capacitance and any variance therein between the gate structures.

BRIEF DESCRIPTION OF THE DRAWINGS

The foregoing and other features and advantages of the disclosure will become more apparent by describing in detail exemplary embodiments thereof with reference to the following drawings.

FIG. 1b is a plan view of a typical NAND flash memory array corresponding to the schematic view of FIG. 1a.

DETAILED DESCRIPTION OF EXAMPLE EMBODIMENTS

Figure 1A:
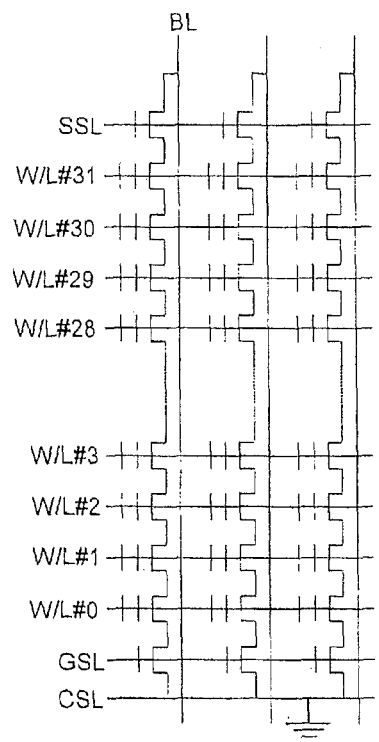
FIG. 1a is a circuit diagram of a typical NAND flash memory array.
Figure 1B:
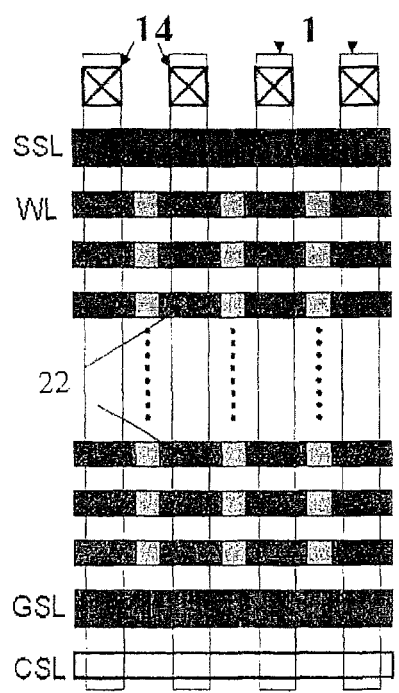
Figure 1C:
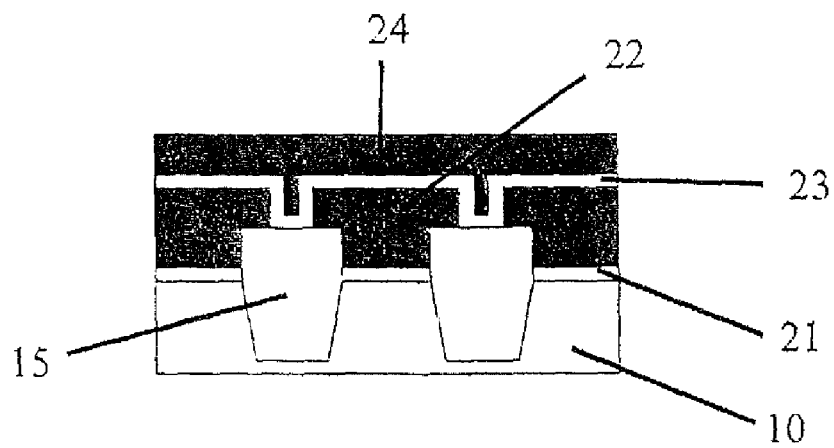
FIG. 1c is a cross-sectional view of a NAND flash memory structure of FIG. 1 taken along the wordline direction.
Figure 1D:
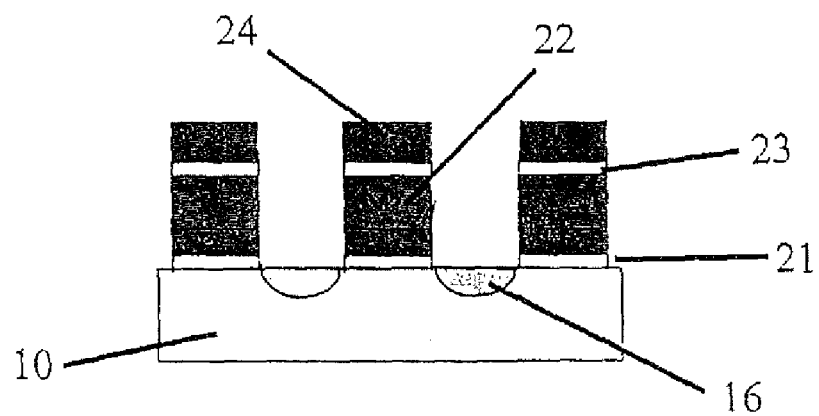
FIG. 1d is a cross-sectional view of a NAND flash memory structure of FIG. 1 taken along the bitline direction.
Figure 2:
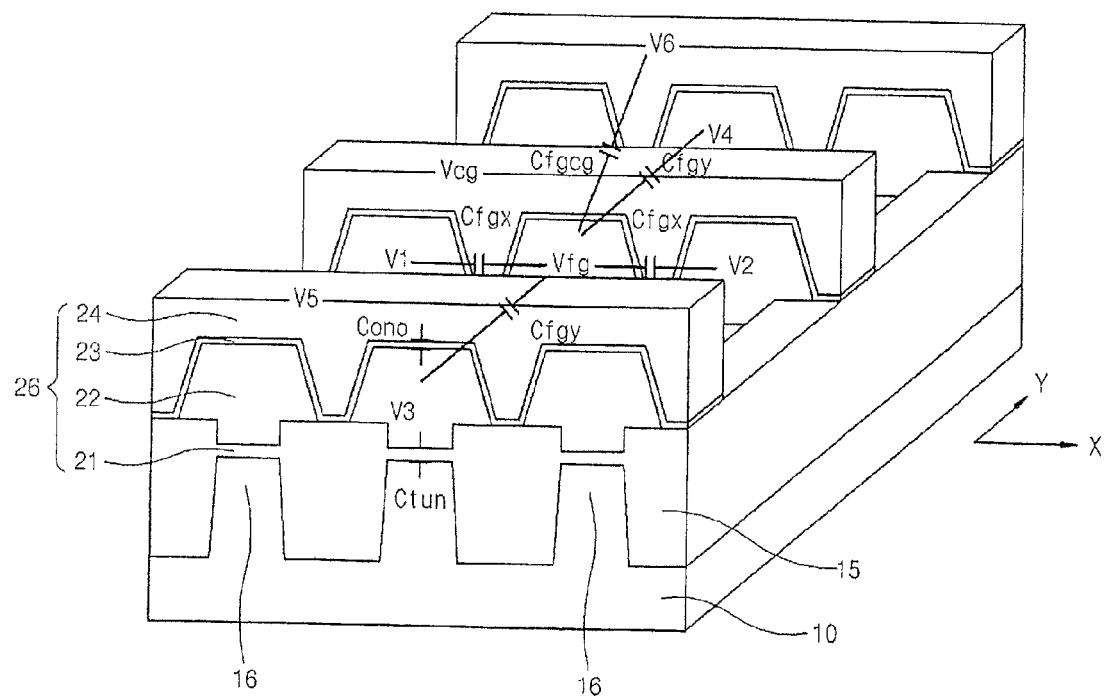
FIG. 2 is a perspective view of a NAND flash memory structure showing various voltages and capacitances associated with the structure.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be to include deviations in shapes that result, for example, from manufacturing.

Figure 3:
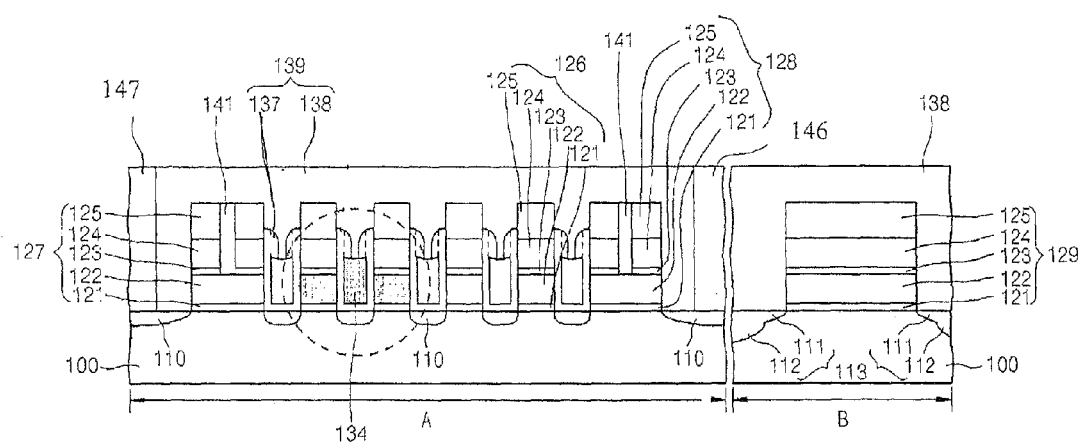
FIG. 3 is a cross-sectional view of a non-volatile memory structure in accordance with an embodiment of the present invention.

FIG. 3 is a partial cross-sectional view of a semiconductor device in accordance with an embodiment of the present invention.

Referring to FIG. 3, a semiconductor device includes a plurality of gate structures, e.g., a ground select gate structure 127, a plurality of cell gate structures 126, a string select gate structure 128, and a high voltage gate structure 129. The gate structures may be fabricated on a semiconductor substrate 100 with the ground select, cell, and string select gate structures (127, 126, and 128, respectively) formed in a cell region A of the substrate 100, and the high voltage gate structure 129 formed in a peripheral region B of the substrate 100. Although not shown, a low voltage gate structure may also be formed in the peripheral region B. Each gate structure may include a tunneling dielectric pattern 121, a charge-storage layer 122, an inter-gate dielectric layer 123, a control gate 124, and a hard mask 125 sequentially stacked on the substrate 100. The cell gate structures 126 include the charge-storage layer 122 to store a charge therein for programming. The charge-storage layer 122 may be a polysilicon floating gate or a known charge-trap dielectric layer formed of a material such as silicon nitride or HfAlO. The charge-storage layer 122 may also be formed of a material including silicon nano-crystals. The ground select gate structure 127 and string select gate structure 128 each have a butting contact 141 to allow direct electrical contact through the gate structures to the charge-storage layer 122.

A protection layer 130 (refer briefly to FIG. 5) may cover the gate structures (126, 127, 128, and 129) and the substrate 100. Alternatively, the protection layer 130 may be omitted depending on applications, which will be explained further below.

A second insulation layer pattern 137 is disposed between adjacent cell gate structures 126, between the ground select gate structure 127 and a cell gate structure 126, and between the string select gate structure 128 and a cell gate structure 126. The second insulation layer pattern 137 and the protection layer 130, if formed, may collectively define a plurality of air gaps 134 between the adjacent gate structures. The air gaps 134 may be substantially rectangular in cross-section, as will be explained further below. The air gaps 134 may be formed self-aligned with opposing sidewalls of the at least two adjacent gate structures.

An upper insulation layer 138 covers the gate structures and the air gaps 134. The upper insulation layer 138 may seal the air gaps 134. A bottom portion of the upper insulation layer 138 may overlie the top of the air gaps 134.

Thus, in accordance with one embodiment of the invention, and as may be seen well in the cross-sectional view of FIG. 3, the air gaps 134 are substantially rectangular in cross-section, featuring preferably right-rectilinear sides and sharp, about ninety-degree corners. Moreover, the widths of rectangular air gaps 134 are highly uniform over their height. As will be seen by reference to FIG. 11, the performance of devices, especially the illustrated NAND flash memory, made in accordance with some embodiments of the invention exhibit significantly higher operating speeds than with prior art devices including those without an air gap of substantially rectangular shape and uniform width between adjacent gate structures.

Impurity regions 110 for forming source/drain regions are disposed between the gate structures and below the air, gaps 134. The high voltage gate structure 129 may have associated impurity regions 113 including lightly doped drains (LDD) 111 and highly doped regions 112.

According to one aspect of the invention, a top of the cell gate structure 126 may be higher than a top of the air gaps 134.

According to another embodiment, other combinations of materials for forming the cell gate structures 126 and the substrate 100 are also possible within the spirit and scope of the present invention. For example, the cell gate structure 126 may be a SONOS cell gate structure that includes a silicon oxide tunneling dielectric pattern on a silicon substrate, a nitride (such as silicon nitride) charge-trap layer on the tunneling dielectric pattern, a silicon oxide inter-gate dielectric layer on the charge-trap layer, and a polysilicon control gate on the inter-gate dielectric layer. As another example, the cell gate structure 126 may be a SANOS cell gate structure that includes a silicon oxide tunneling dielectric pattern on a silicon substrate, a nitride (such as silicon nitride) charge-trap layer on the tunneling dielectric pattern, an aluminum oxide ($Al_2O_3$) inter-gate dielectric layer on the charge-trap layer, and a polysilicon control gate on the inter-gate dielectric layer. Yet another example would be a TANOS cell gate structure, which comprises a silicon oxide tunneling dielectric pattern on a silicon substrate, a silicon nitride charge-trap layer on the tunneling dielectric pattern, an aluminum oxide ($Al_2O_3$) inter-gate dielectric layer on the charge-trap layer, and a tantalum nitride (TaN) control gate on the inter-gate dielectric layer.

According to some embodiments, a gate group comprises a ground select gate structure 127, a string select gate structure 128, and a plurality of cell gate structures 126 disposed between the ground select gate structure 127 and the string select gate structure 128. In addition, a common source line 147 is formed adjacent the ground select gate structure 127.

In accordance with some embodiments, the ground select gate structure 127 and the string select gate structure 128 each have a first sidewall facing the cell gate structures 126 and a second sidewall opposite the first sidewall. The second insulation layer pattern 137, the protection layer 130, or both may be formed on the first sidewalls, but may not be placed on some or all of the second sidewalls.

With no protection layer 130 and/or the second insulation layer pattern 137 disposed on the second sidewall of the string select gate structure 128 facing (adjacent) a bit line contact 146 in a direct contact (DC) region, voids leading to shorts in the DC region, particularly between the bit line contacts 146 can be avoided. Further, when there is no protection layer 130 and/or second insulation layer pattern 137 disposed on the second sidewall of the ground select gate structure 127 facing the common source line 147, the devices can be further scaled down without reducing the width of the common source line 147. This prevents resistance from being increased in the area of the common source line 147.

Also, the second insulation layer pattern 137 may be or may not be placed on either sidewall of the high voltage gate structure 129 depending on applications.

As discussed in the background, it is desirable to maximize the volume of the air gaps 134 between adjacent charge-storage layers 122 in order to minimize the parasitic capacitances. To accomplish this, the air gap 134 may be substantially rectangular in cross-section. Also, the air gap 134 may have a substantially uniform width along most if not all of their height. The width of each air gap 134 may be measured from one sidewall of the air gap 134 to the opposite sidewall of the air gap 134 along the direction parallel to the plane of the substrate 100. In order to have a substantially uniform width, the air gaps 134 may have substantially vertical sidewalls with respect to the substrate 100. The air gaps 134 may also have substantially horizontal tops and bottoms. The air gaps 134 may extend along substantially the entire sidewalls of the charge-storage layer patterns 122. In other words, the air gaps 134 may extend vertically from the substrate 100 to an extent greater than or equal to the vertical extent of the charge-storage layers 122. However, the air gaps 134 may not need to extend along the entire sidewalls of the charge-storage layer patterns 122 depending on applications.

Those of skill in the art will appreciate that the substantially uniform width of the air gaps 134 in accordance with one embodiment of the invention, while minimizing parasitic capacitance due to greater air gap volume, also minimizes any variation in parasitic capacitance over most if not all of the height of the air gap. This is due to the verticality of the sidewalls and due to the uniformity of width of the air gaps that produces the substantially rectangular cross-section of the air gaps 134. Unlike with prior art devices featuring curved or tapered sidewalls of variable width that produce air gaps of inversely variable width, the invented devices have air gaps 134 the dielectric value of which is substantially the same over the substantial height of the air gaps 134. This minimizes variation in parasitic capacitance at various heights or near various irregular features of the air gaps 134 and their surrounding sidewalls that undesirably produce more parasitic capacitance near the tops and bottoms of the air gaps than near the middles of the air gaps as typified by the prior art teardrop-shaped or oval air gaps). Thus, with features of the present invention, the reliability of the semiconductor devices can be substantially improved.

According to some embodiments the protection layer 130 may be formed conformally on the sidewalls of the gate structures, e.g., 126 and on the substrate 100 so as to form the sidewalls and bottoms of the air gaps 134. Vertical portions of the protection layer 130, disposed on opposing sidewalls of adjacent gate structures thereby defining the sidewalls of the air gaps 134, may have a substantially uniform thickness throughout the vertical extent of the air gaps 134. Horizontal portions of the protection layer 130, defining the bottoms of the air gaps 134, may have a substantially uniform thickness as well.

According to some other aspects of the present invention, the thickness of the vertical portions and the horizontal, portions may be substantially the same. The inner sidewall of the vertical portions may form an approximately 90 degree angle with a top surface of the horizontal portions. The vertical portions of the protection layer 130 may be said to have an inner sidewall and an outer sidewall, the outer sidewall adjoining the sidewalls of the gate structures, and the inner sidewall may be substantially parallel with the sidewalls of the gate structures.

In accordance with some embodiments, the second insulation layer pattern 137 and the protection layer 130 may form a spacer layer pattern on the sidewalls of the gate structures, e.g., 126. In this case, the spacer layer pattern may include an upper portion and a lower portion. And the lower portion may have a substantially uniform thickness along substantially the entire sidewalls of the gate structures. If the protection layer 130 is not used, the second insulation layer pattern 137 alone forms the spacer layer pattern on an upper portion of the sidewalls of the gate structures. In this case, the spacer layer pattern may not be formed between the air gaps 134 and the sidewalls of the gate structures. In other words, the sidewalls of the gate structures may directly define the sidewalls of the air gaps 134. Thus, if the protection layer 130 is not formed, the air gaps 134 may be primarily defined by the opposing sidewalls of the gate structure, e.g. 126 and the second insulation layer pattern 137.

Further, if the protection layer 130 is not used to form the air gaps 134, the inter-gate dielectric layer 123 has an etch selectivity with respect to the first insulation layer 132 as will be further explained below in conjunction with FIGS. 5-6.

The spacer layer pattern may overhang a portion of the tops of the air gaps 134. The upper insulation layer 138 may cover the remaining portion of the tops of the air gaps 134. The protection layer pattern 130 may also not be formed between bottoms of the air gaps 134 and the substrate 100. In other words, the substrate 100 may directly define the bottoms of the air gaps 134.

FIGS. 4 through 10 are cross-sectional views illustrating a method of manufacturing a semiconductor device in accordance with some embodiments of the present invention.

Figure 4:
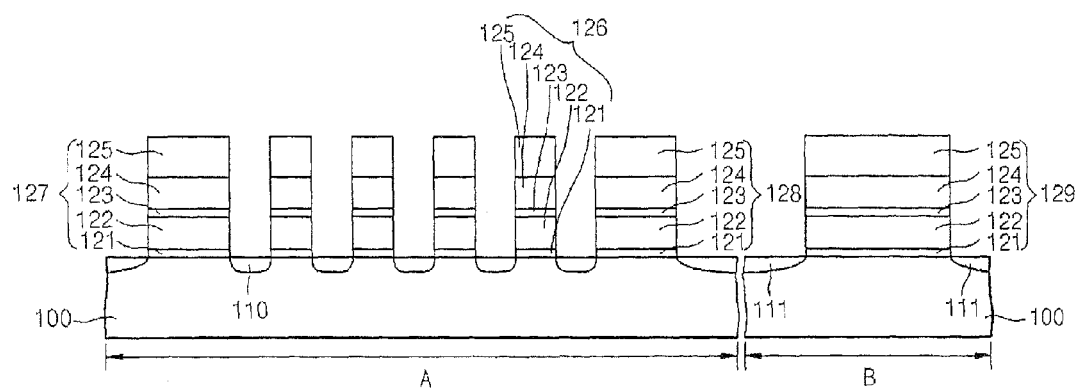
FIGS. 4 through 10 are cross-sectional views illustrating a method of manufacturing a non-volatile memory structure in accordance with some embodiments.

Referring to FIG. 4, manufacturing a semiconductor device, e.g., a flash memory structure includes forming a ground select gate structure 127, a string select gate structure 128, and a plurality of cell gate structures 126, between the ground select gate structure 127 and the string select gate structure 128, on a cell region A of a semiconductor substrate 100, and forming a high voltage gate structure 129 or a low voltage gate structure (not shown) on a peripheral region B of the substrate 100. The gate structures each may include a tunneling dielectric pattern 121, a charge-storage layer 122, an inter-gate dielectric layer 123, a control gate 124, and a hard mask 125, which are sequentially stacked. The hard mask 125 may comprise high-temperature oxide (HTO), nitride or other suitable material. The gate structures are then used as implantation masks for self-aligned formation of source/drain regions 110 in the cell region A and LDD regions 111 in the peripheral region B.

Figure 5:
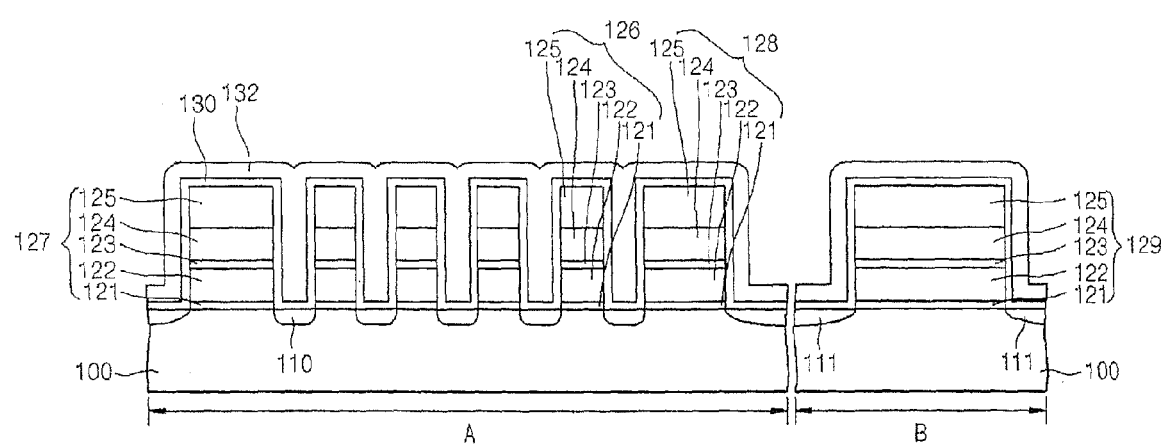

Referring to FIG. 5, a protection layer 130 may be conformally formed over the gate structures and the substrate 100, thereby covering the top and the sidewalls of the gate structures. Then, a first insulation layer 132 may be formed over the protection layer 130. The protection layer 130 may act as an etch stop layer during subsequent etch processes. The protection layer 130 may have an etch selectivity with respect to the first insulation layer 132. As an example, the protection layer 130 may be, but not limited to, a silicon nitride layer and the first insulation layer 132 may be a silicon oxide layer, for example. Specifically, the first insulation layer 132 may be a medium temperature oxide (MTO) layer deposited by a low pressure chemical vapor deposition (LPCVD) process, for instance. Also, the protection layer 130 may comprise any material having an etch selectivity with the first insulation layer 132.

According to some embodiments though, the protection layer 130 may not be formed, in which case, the first insulation layer 132 be directly formed on the top and the sidewalls of the gate structures. In this case, the inter-gate dielectric layer 123 may have an etch selectivity with the first insulation layer 132.

Figure 6:
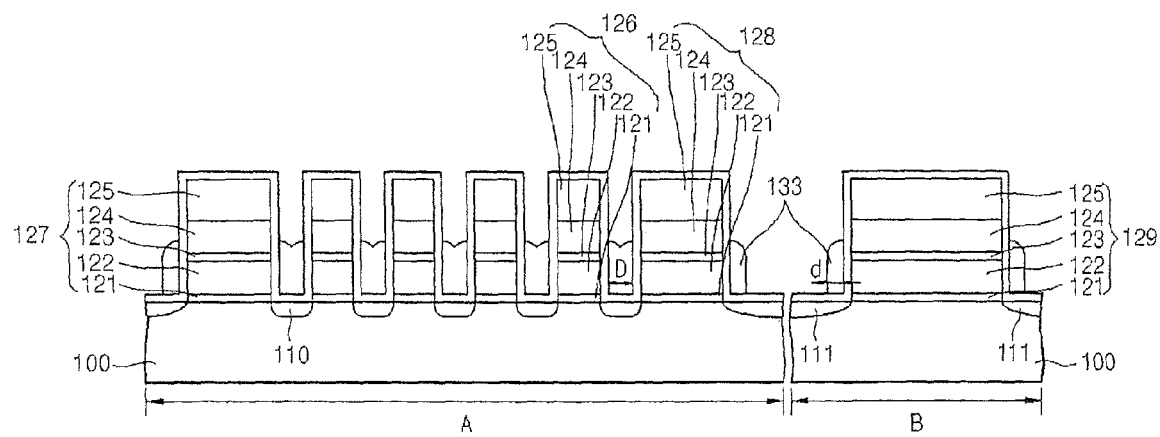

Referring to FIG. 6, a portion of the first insulation layer 132 is then removed, e.g., etched to form a first insulation layer pattern 133. The etching of the first insulation layer 132 may expose a region of the sidewalls of the gate structures. The first insulation layer pattern 133 is thus formed on the sidewalls of the gate structures and above the source/drain regions 110. In other words, the first insulation layer pattern 133 extends between the adjacent gate structures. If the protection layer 130 is used, it remains on the tops and sidewalls of the gate structures and on the substrate 100 after the etching of the first insulation layer 132 as shown.

Figure 7:
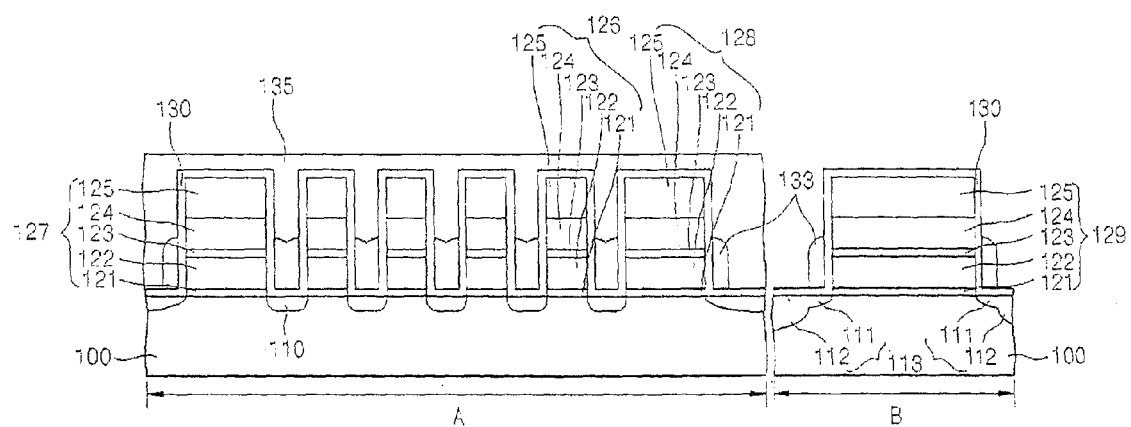

Referring to FIG. 7, a photoresist pattern 135 may be formed covering the cell region A. Impurity regions 113 are then formed around the high voltage gate structure 129 by forming highly-doped regions 112 in addition to the already-formed LDD regions 111 in the peripheral region B. The highly-doped regions 112 may be formed by ion implantation using the high voltage gate structure 129 and the first insulation layer pattern 133 as an implantation mask.

Figure 8:
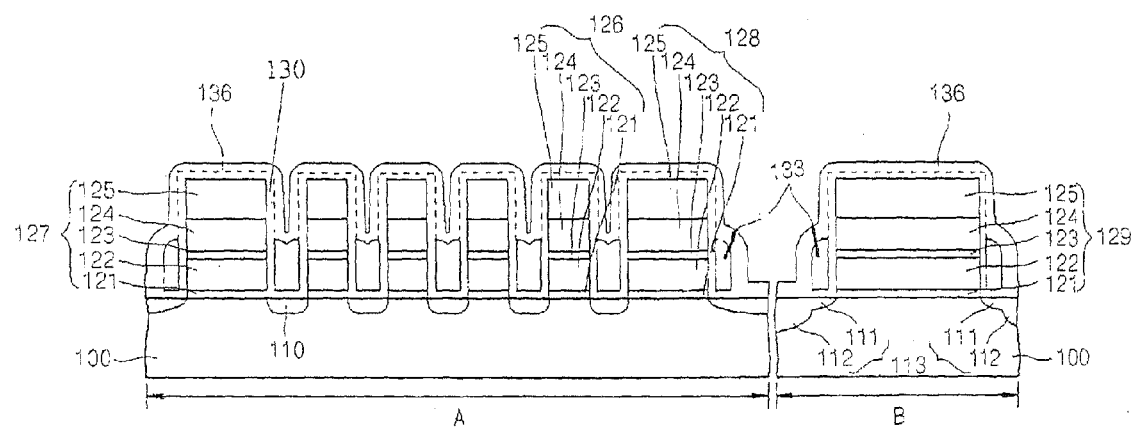
Figure 9:
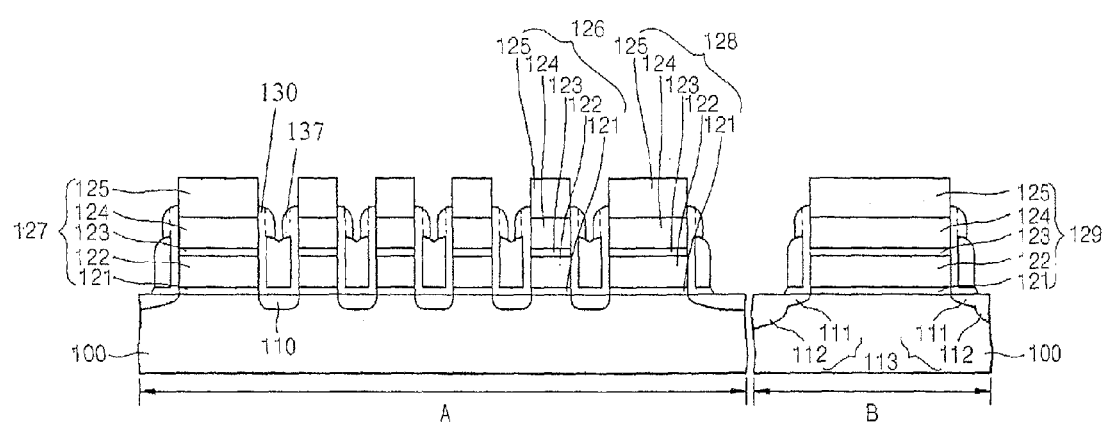

Referring to FIGS. 8 and 9, the photoresist pattern 135 is removed using conventional techniques such as asking. Then, a second insulation layer 136 is formed over the protection layer 130 (if used) and the first insulation layer pattern 133. The second insulation layer 136 is partially etched or etched back to form the second insulation layer pattern 137. The second insulation layer pattern 137 has an opening 131 to expose an upper surface of the first insulation layer pattern 133. If the protection layer 130 is used, the etching of the second insulation layer 136 may include an etching of a portion of the protection layer 130, thereby exposing the top and a portion of the sidewalls of the hard mask 125.

Figure 10:
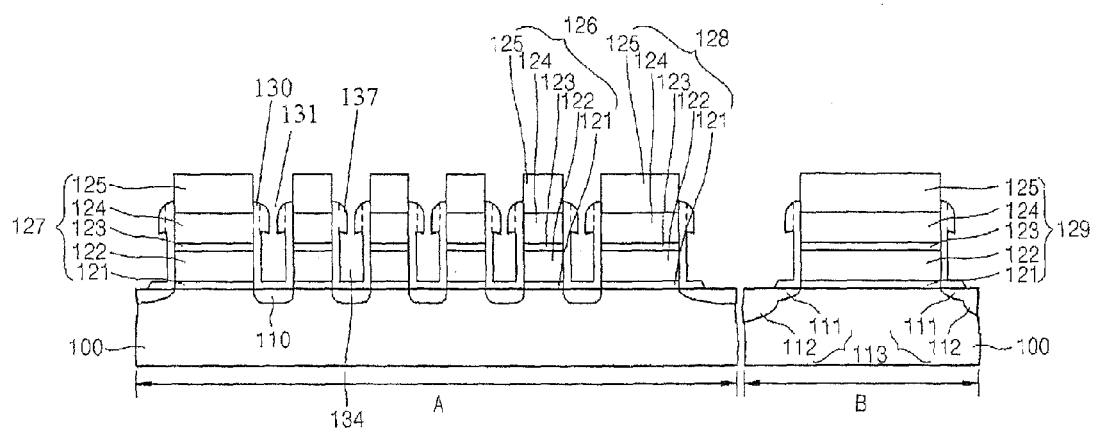

Referring to FIG. 10, the first insulation layer pattern 133 is then selectively removed by, for example, etching through the opening 131 defined by the second insulation layer pattern 137, to form the air gaps 134. The air gaps 134 are substantially rectangular in cross-section to maximize the size of the air gap 134 and to minimize the adverse effect of parasitic capacitance between adjacent gate structures (and, as indicated above, further to minimize variances in any parasitic capacitance, i.e. to render uniform the parasitic capacitance, therebetween over the substantial height of the air gap 134).

If the protection layer 130 is used, the protection layer 130 may define the sidewalls and bottoms of the air gaps 134. In this case, the air gaps 134 may be substantially surrounded by the protection layer 130 and the second insulation layer pattern 137. If the protection layer 130 is not used, the gate structures may directly define the sidewalls of the air gaps 134 and the substrate 100 may directly define the bottoms of the air gaps 134 as discussed above.

Wet etching may be used to remove the first insulation layer pattern 133. For example, hydrofluoric acid may be used to etch the first insulation layer pattern 133. The second insulation layer pattern 137 and/or the protection layer 130 may act as an etch stop during the process for removing the first insulation layer pattern 133.

Once the first insulation layer pattern 133 has been removed, a portion of the second insulation layer pattern 137 may form an overhang over the tops of the air gaps 134. If the protection layer 130 is used, it will prevent the gate structure, particularly the inter-gate dielectric layer 123 from being etched while the first insulation layer pattern 133 is removed, e.g., etched. If the protection layer 130 is not used, it is desirable that the inter-gate dielectric layer 123 have an etch selectivity with respect to the first insulation layer pattern 133 to protect itself from the etchant, as discussed above.

According to one aspect of the invention, any remaining portions of the second insulation layer pattern 137 and/or the protection layer 130 may be removed from one sidewall of the string select gate structure 128 and one sidewall of the ground select gate structure 127 as discussed above with reference to FIG. 3 although not illustrated. For example, in the cell region A, a region between adjacent string select gate structures 128, i.e., a DC region in which the bit line contact 146 is formed, may be opened while other regions are covered by, for example, a photoresist pattern. Then, the spacer layer pattern, i.e., the protection layer 130 and/or the second insulation layer pattern 137 may be selectively removed from one of the sidewalls of the string select gate structures 128 in the DC region by, for example, wet etching using phosphoric acid or dry etching. As a result, the spacer layer pattern is formed selectively not to extend along one of the sidewalls of the string select gate 128 adjacent the bit line contact 146.

In addition, the spacer layer pattern, i.e., the protection layer 130 and/or the second insulation layer pattern 137, may be selectively removed from one of the sidewalls of the ground select gate structure 127 near the common source line 147, using the immediately-above described method. As a result, the spacer layer pattern is formed selectively not to extend along one of the sidewalls of the ground select gate structure 127 facing the common source line 147.

Also, in the peripheral region B, the spacer layer pattern may also be selectively removed from the high voltage gate structure 129 or the low voltage structure using the above method described to remove the spacer layer pattern in the cell region A. However, the spacer layer pattern may remain in the peripheral region B.

Referring again to FIG. 3, an interlayer insulation layer 138 is then formed to cover the gate structures and the air gaps 134. Therefore, a bottom portion of the interlayer insulation layer directly overlies a top of the air gaps 134.

Figure 11:
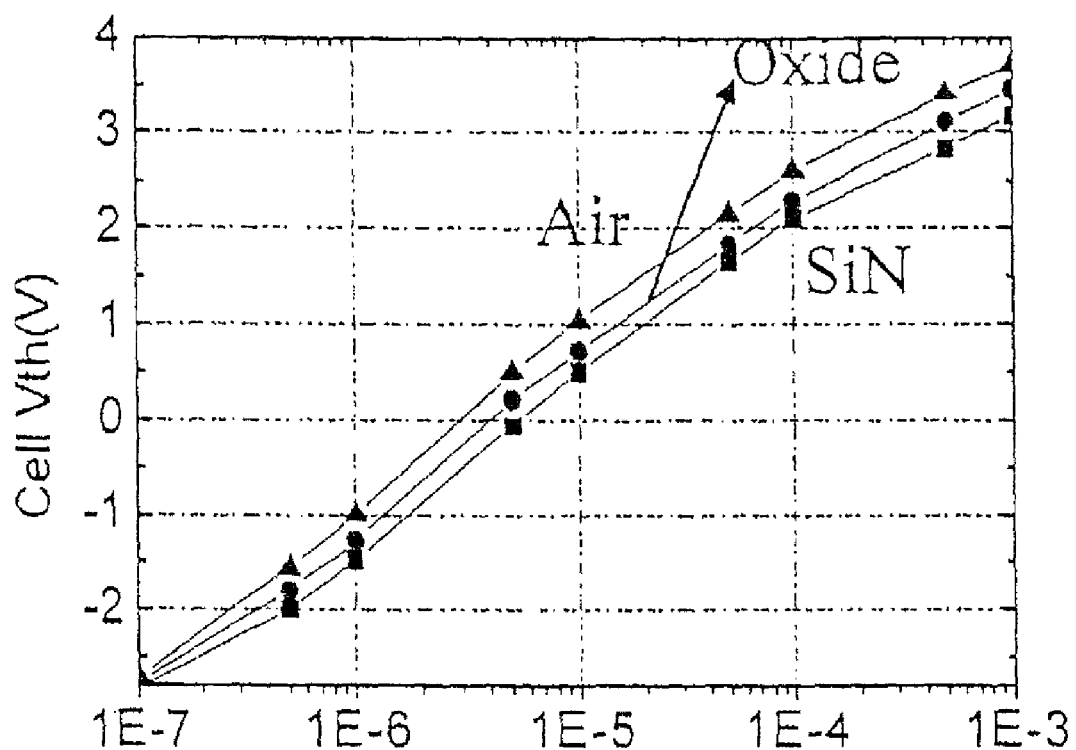
FIG. 11 is a graph showing experimental results of programming speed for devices fabricated according to some embodiments.

Afterwards, although not shown, a bit line is formed on the resulting structure to be coupled to one of the plurality of impurity regions 110 via the bit line contact 146 adjacent the string select gate structure 128 from which the spacer layer pattern is removed FIG. 11 is a graph showing experimental results of programming speed for devices fabricated according to some embodiments of the present invention.

Referring to FIG. 11, NAND flash structures were formed and tested using various dielectric materials between adjacent gate structures. The program voltage was estimated to be about 20V. The experimental results show that higher programming speed was achieved for the device structures having an air gap according to some embodiments, than either of the conventional silicon oxide or nitride materials without such an air gap between gate structures.

Figure 12:
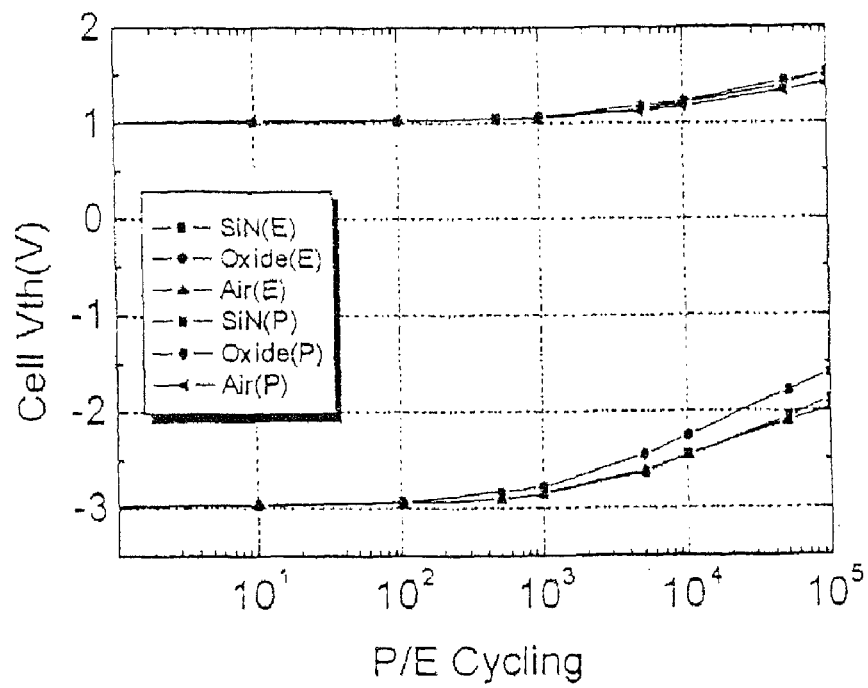
FIG. 12 is a plot of endurance characteristics for various dielectric materials.

FIG. 12 is a plot of endurance characteristics for various dielectric materials.

Referring to FIG. 12, the plot compares the endurance characteristics of a 1 Gbit NAND flash memory cell having a rectangular air gap defined between adjacent gate structures to cells using silicon nitride (SiN) or oxide filled between the gate structures without such an air gap. The plot shows that after extensive program/erase (P/E) cycling, negligible difference in the $V_{th}$ distribution between the device fabricated according to some embodiments of the present invention and the cells having silicon nitride (SiN) or oxide filled between the gate structures without such an air gap is observed. Therefore, the endurance characteristics of the cell are not degraded by having an air gap as discussed above as opposed to the conventional structures.

Figure 13:
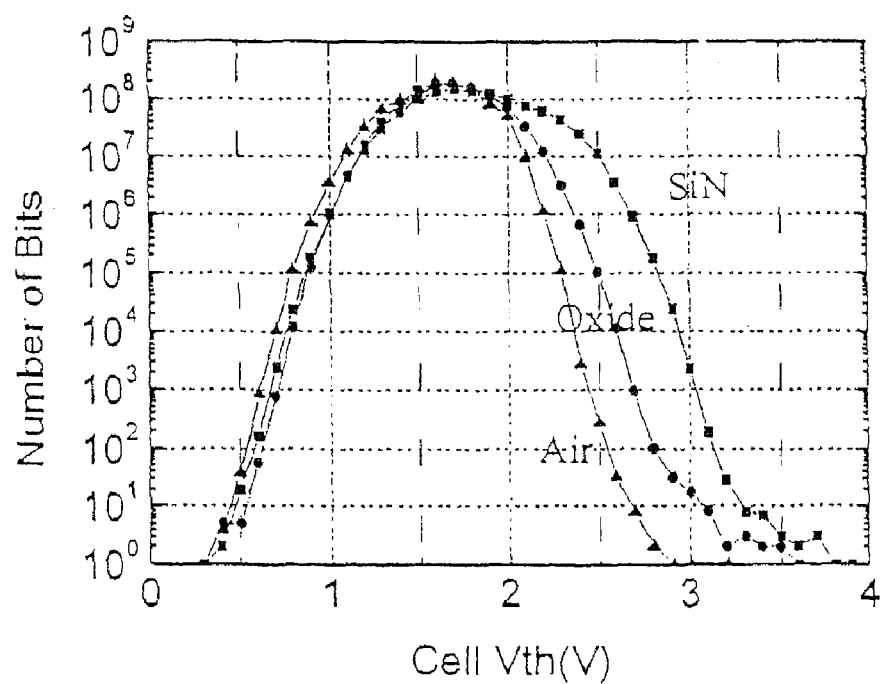
FIG. 13 is a plot of experimental results showing the threshold voltage distribution in a NAND flash memory for various dielectric materials.

FIG. 13 is a plot of experimental results showing the threshold voltage distribution in a 1 Gbit NAND flash memory for various dielectric materials.

Referring to FIG. 13, the plot compares the cell threshold voltage ($V_{th}$) distribution of a 1 Gbit NAND flash memory cell using a single pulse program. The plot shows that the $V_{th}$ distribution is dramatically improved with the cells formed according to some embodiments of the present invention as opposed to the cells formed using prior art methods having oxide or silicon nitride (SiN) filled between gate structures without air gaps. This improvement in $V_{th}$ distribution is believed to be due to the improved floating gate voltage shift with the air gap.

Semiconductor devices, e.g., non-volatile memory devices formed according to some of the embodiments described herein can be used in various electronic systems such as cellular phones, digital cameras, digital televisions, and video game systems. Additionally, the memory devices can be used in various types of memory cards such as Compact Flash, Memory Stick, xD Picture Card, Smart Media, and other multimedia card types. Further, non-volatile memory devices may be operatively coupled with other types of semiconductor devices, such as dynamic random access memory (DRAM) devices and/or microprocessors, in the foregoing applications. In some cases, a non-volatile memory such as a NAND flash memory device and a DRAM device may be incorporated together in a single integrated circuit (IC) package, also known as a ND chip.

The foregoing description is illustrative and is not to be construed as limiting of the disclosure. Although a few example embodiments have been described, those skilled in the art will readily appreciate that many modifications are possible in the example embodiments without materially departing from the novel teachings and advantages of the disclosure. For example, the embodiments have been described with respect to NAND flash memory applications, but the inventive principles could also be applied to other types of memory devices, such as NOR-type flash memories. Accordingly, all such modifications are intended to be included within the scope of the disclosure as defined in the claims.

That which is claimed is:

1. A semiconductor device comprising:

a plurality of gate structures disposed on a semiconductor substrate, each of the gate structures including a tunnel dielectric layer, a floating gate, an inter-gate dielectric layer, a control gate, and a mask layer;

liners covering opposing sidewalls of adjacent floating gates; and spacers disposed on the liners, the spacers protruding from opposing sidewalls of adjacent ones of the gate structures, and a top of each of the spacers disposed below a top of a corresponding one of the gate structures, wherein the liners define sidewalls of respective air gaps and the spacers define tops of the respective air gaps.

2. The device of claim 1, wherein each of the spacers has a vertical portion abutting a sidewall of the corresponding one of the gate structures, and wherein a width of each of the spacers decreases toward the top of each of the spacers.

3. The device of claim 1, wherein a thickness of each of the liners is less than that of each of the spacers.

4. The device of claim 1, wherein the liners extend contiguously across a surface of the substrate.

5. The device of claim 4, wherein the liners are conformally formed on the opposing sidewalls of the adjacent floating gates and on the substrate.

6. The device of claim 5, wherein a shape of each of the respective air gaps corresponds to the liners defining the sidewalls thereof.

7. The device of claim 1, wherein the tops of the respective air gaps are substantially planar.

8. The device of claim 1, wherein the tops of the respective air gaps are concave.

9. The device of claim 1, wherein each of the spacers exposes an upper sidewall of the corresponding one of the gate structures.

10. The device of claim 1, wherein the spacers define openings in the tops of the respective air gaps.

11. The device of claim 10, further comprising an insulating layer disposed between the adjacent gate structures, the insulating layer disposed on the spacers to seal the openings defined by the spacers.

12. The device of claim 11, wherein the insulating layer has a protruding portion and the protruding portion is disposed between opposing spacers.

13. The device of claim 12, wherein a width of each of the respective air gaps is greater than that of the protruding portion.

* * * * *